(12) United States Patent
Kay et al.

(10) Patent No.: US 9,024,688 B2
(45) Date of Patent: May 5, 2015

(54) DUAL PARALLEL AMPLIFIER BASED DC-DC CONVERTER

(71) Applicant: RF Micro Devices, Inc., Greensboro, NC (US)

(72) Inventors: Michael R. Kay, Summerfield, NC (US); Andrew F. Folkmann, Cedar Rapids, IA (US); Nadim Khlat, Cugnaux (FR); Philippe Gorisse, Brax (FR)

(73) Assignee: RF Micro Devices, Inc., Greensboro, NC (US)

( * ) Notice: Subject to any disclaimer, the term of this patent is extended or adjusted under 35 U.S.C. 154(b) by 82 days.

(21) Appl. No.: 13/782,142

(22) Filed: Mar. 1, 2013

(65) Prior Publication Data

US 2013/0176075 A1  Jul. 11, 2013

Related U.S. Application Data

(63) Continuation-in-part of application No. 13/661,552, filed on Oct. 26, 2012.

(60) Provisional application No. 61/605,267, filed on Mar. 1, 2012, provisional application No. 61/551,596, filed on Oct. 26, 2011, provisional application No. 61/562,493, filed on Nov. 22, 2011.

(51) Int. Cl.
*H03G 3/20* (2006.01)
*G05F 1/46* (2006.01)
(Continued)

(52) U.S. Cl.
CPC .. *G05F 1/46* (2013.01); *H03F 1/02* (2013.01); *H03F 1/0266* (2013.01); *H03F 3/195* (2013.01); *H03F 3/24* (2013.01); *H03F 2200/432* (2013.01); *H03F 2200/555* (2013.01)

(58) Field of Classification Search
CPC .... H03F 1/0211; H03F 1/0227; H03F 1/0238
USPC .................................................. 330/127, 297
See application file for complete search history.

(56) References Cited

U.S. PATENT DOCUMENTS

| 3,969,682 A | 7/1976 | Rossum |
| 3,980,964 A | 9/1976 | Grodinsky |

(Continued)

FOREIGN PATENT DOCUMENTS

| CN | 1211355 A | 3/1999 |
| CN | 1898860 A | 1/2007 |

(Continued)

OTHER PUBLICATIONS

Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.

(Continued)

*Primary Examiner* — Steven J Mottola
(74) *Attorney, Agent, or Firm* — Withrow & Terranova, P.L.L.C.

(57) ABSTRACT

A direct current (DC)-DC converter, which includes switching circuitry, a first parallel amplifier, and a second parallel amplifier, is disclosed. The switching circuitry has a switching circuitry output. The first parallel amplifier has a first feedback input and a first parallel amplifier output. The second parallel amplifier has a second feedback input and a second parallel amplifier output. A first inductive element is coupled between the switching circuitry output and the first feedback input. A second inductive element is coupled between the first feedback input and the second feedback input.

26 Claims, 10 Drawing Sheets

(51) Int. Cl.
  *H03F 1/02* (2006.01)
  *H03F 3/195* (2006.01)
  *H03F 3/24* (2006.01)

(56) References Cited

U.S. PATENT DOCUMENTS

| | | | |
|---|---|---|---|
| 4,587,552 A | 5/1986 | Chin | |
| 4,692,889 A | 9/1987 | McNeely | |
| 4,831,258 A | 5/1989 | Paulk et al. | |
| 4,996,500 A | 2/1991 | Larson et al. | |
| 5,099,203 A | 3/1992 | Weaver et al. | |
| 5,146,504 A | 9/1992 | Pinckley | |
| 5,187,396 A | 2/1993 | Armstrong, II et al. | |
| 5,311,309 A | 5/1994 | Ersoz et al. | |
| 5,317,217 A | 5/1994 | Rieger et al. | |
| 5,351,087 A | 9/1994 | Christopher et al. | |
| 5,414,614 A | 5/1995 | Fette et al. | |
| 5,420,643 A | 5/1995 | Romesburg et al. | |
| 5,457,620 A | 10/1995 | Dromgoole | |
| 5,486,871 A | 1/1996 | Filliman et al. | |
| 5,532,916 A | 7/1996 | Tamagawa | |
| 5,541,547 A | 7/1996 | Lam | |
| 5,581,454 A | 12/1996 | Collins | |
| 5,646,621 A | 7/1997 | Cabler et al. | |
| 5,715,526 A | 2/1998 | Weaver, Jr. et al. | |
| 5,767,744 A | 6/1998 | Irwin et al. | |
| 5,822,318 A | 10/1998 | Tiedmann, Jr. et al. | |
| 5,898,342 A | 4/1999 | Bell | |
| 5,905,407 A | 5/1999 | Midya | |
| 5,936,464 A | 8/1999 | Grondahl | |
| 6,043,610 A | 3/2000 | Buell | |
| 6,043,707 A | 3/2000 | Budnik | |
| 6,055,168 A | 4/2000 | Kotowski et al. | |
| 6,070,181 A | 5/2000 | Yeh | |
| 6,118,343 A | 9/2000 | Winslow | |
| 6,133,777 A | 10/2000 | Savelli | |
| 6,141,541 A | 10/2000 | Midya et al. | |
| 6,147,478 A | 11/2000 | Skelton et al. | |
| 6,198,645 B1 | 3/2001 | Kotowski et al. | |
| 6,204,731 B1 | 3/2001 | Jiang et al. | |
| 6,256,482 B1 | 7/2001 | Raab | |
| 6,300,826 B1 | 10/2001 | Mathe et al. | |
| 6,313,681 B1 | 11/2001 | Yoshikawa | |
| 6,348,780 B1 | 2/2002 | Grant | |
| 6,400,775 B1 | 6/2002 | Gourgue et al. | |
| 6,483,281 B2 | 11/2002 | Hwang | |
| 6,559,689 B1 | 5/2003 | Clark | |
| 6,566,935 B1 | 5/2003 | Renous | |
| 6,583,610 B2 | 6/2003 | Groom et al. | |
| 6,617,930 B2 | 9/2003 | Nitta | |
| 6,621,808 B1 | 9/2003 | Sadri | |
| 6,624,712 B1 | 9/2003 | Cygan et al. | |
| 6,658,445 B1 | 12/2003 | Gau et al. | |
| 6,681,101 B1 | 1/2004 | Eidson et al. | |
| 6,690,652 B1 | 2/2004 | Sadri | |
| 6,701,141 B2 | 3/2004 | Lam | |
| 6,703,080 B2 * | 3/2004 | Reyzelman et al. | 427/445 |
| 6,728,163 B2 | 4/2004 | Gomm et al. | |
| 6,744,151 B2 | 6/2004 | Jackson et al. | |
| 6,819,938 B2 | 11/2004 | Sahota | |
| 6,885,176 B2 | 4/2005 | Librizzi | |
| 6,958,596 B1 | 10/2005 | Sferrazza et al. | |
| 6,995,995 B2 | 2/2006 | Zeng et al. | |
| 7,038,536 B2 | 5/2006 | Cioffi et al. | |
| 7,043,213 B2 | 5/2006 | Robinson et al. | |
| 7,053,718 B2 | 5/2006 | Dupuis et al. | |
| 7,058,373 B2 | 6/2006 | Grigore | |
| 7,099,635 B2 | 8/2006 | McCune | |
| 7,170,341 B2 | 1/2007 | Conrad et al. | |
| 7,200,365 B2 | 4/2007 | Watanabe et al. | |
| 7,233,130 B1 | 6/2007 | Kay | |
| 7,253,589 B1 | 8/2007 | Potanin et al. | |
| 7,254,157 B1 | 8/2007 | Crotty et al. | |
| 7,279,875 B2 | 10/2007 | Gan et al. | |
| 7,348,847 B2 | 3/2008 | Whittaker | |
| 7,394,233 B1 | 7/2008 | Trayling et al. | |
| 7,405,618 B2 | 7/2008 | Lee et al. | |
| 7,411,316 B2 | 8/2008 | Pai | |
| 7,414,330 B2 | 8/2008 | Chen | |
| 7,515,885 B2 | 4/2009 | Sander et al. | |
| 7,528,807 B2 | 5/2009 | Kim et al. | |
| 7,529,523 B1 | 5/2009 | Young et al. | |
| 7,539,466 B2 | 5/2009 | Tan et al. | |
| 7,595,569 B2 | 9/2009 | Amerom et al. | |
| 7,609,114 B2 | 10/2009 | Hsieh et al. | |
| 7,615,979 B2 | 11/2009 | Caldwell | |
| 7,627,622 B2 | 12/2009 | Conrad et al. | |
| 7,646,108 B2 | 1/2010 | Paillet et al. | |
| 7,653,366 B2 | 1/2010 | Grigore | |
| 7,679,433 B1 | 3/2010 | Li | |
| 7,684,216 B2 | 3/2010 | Choi et al. | |
| 7,696,735 B2 | 4/2010 | Oraw et al. | |
| 7,715,811 B2 | 5/2010 | Kenington | |
| 7,724,837 B2 | 5/2010 | Filimonov et al. | |
| 7,773,691 B2 | 8/2010 | Khlat et al. | |
| 7,777,459 B2 | 8/2010 | Williams | |
| 7,782,036 B1 | 8/2010 | Wong et al. | |
| 7,783,269 B2 | 8/2010 | Vinayak et al. | |
| 7,800,427 B2 | 9/2010 | Chae et al. | |
| 7,805,115 B1 | 9/2010 | McMorrow et al. | |
| 7,856,048 B1 | 12/2010 | Smaini et al. | |
| 7,859,336 B2 | 12/2010 | Markowski et al. | |
| 7,880,547 B2 | 2/2011 | Lee et al. | |
| 7,894,216 B2 | 2/2011 | Melanson | |
| 7,898,268 B2 | 3/2011 | Bernardon et al. | |
| 7,898,327 B2 | 3/2011 | Nentwig | |
| 7,907,010 B2 | 3/2011 | Wendt et al. | |
| 7,915,961 B1 | 3/2011 | Li | |
| 7,923,974 B2 | 4/2011 | Martin et al. | |
| 7,965,140 B2 | 6/2011 | Takahashi | |
| 7,994,864 B2 | 8/2011 | Chen et al. | |
| 8,000,117 B2 | 8/2011 | Petricek | |
| 8,008,970 B1 | 8/2011 | Homol et al. | |
| 8,022,761 B2 | 9/2011 | Drogi et al. | |
| 8,026,765 B2 | 9/2011 | Giovannotto | |
| 8,044,639 B2 | 10/2011 | Tamegai et al. | |
| 8,068,622 B2 | 11/2011 | Melanson et al. | |
| 8,081,199 B2 | 12/2011 | Takata et al. | |
| 8,093,951 B1 | 1/2012 | Zhang et al. | |
| 8,159,297 B2 | 4/2012 | Kumagai | |
| 8,164,388 B2 | 4/2012 | Iwamatsu | |
| 8,174,313 B2 | 5/2012 | Vice | |
| 8,183,917 B2 | 5/2012 | Drogi et al. | |
| 8,183,929 B2 | 5/2012 | Grondahl | |
| 8,198,941 B2 | 6/2012 | Lesso | |
| 8,204,456 B2 | 6/2012 | Xu et al. | |
| 8,242,813 B1 | 8/2012 | Wile et al. | |
| 8,274,332 B2 | 9/2012 | Cho et al. | |
| 8,289,084 B2 | 10/2012 | Morimoto et al. | |
| 8,362,837 B2 | 1/2013 | Koren et al. | |
| 8,541,993 B2 | 9/2013 | Notman et al. | |
| 8,542,061 B2 | 9/2013 | Levesque et al. | |
| 8,548,398 B2 | 10/2013 | Baxter et al. | |
| 8,558,616 B2 | 10/2013 | Shizawa et al. | |
| 8,588,713 B2 | 11/2013 | Khlat | |
| 8,611,402 B2 | 12/2013 | Chiron | |
| 8,618,868 B2 | 12/2013 | Khlat et al. | |
| 8,624,576 B2 | 1/2014 | Khlat et al. | |
| 8,624,760 B2 | 1/2014 | Ngo et al. | |
| 8,626,091 B2 | 1/2014 | Khlat et al. | |
| 8,638,165 B2 | 1/2014 | Shah et al. | |
| 8,648,657 B1 | 2/2014 | Rozenblit | |
| 8,659,355 B2 | 2/2014 | Henshaw et al. | |
| 8,718,582 B2 | 5/2014 | See et al. | |
| 2002/0071497 A1 | 6/2002 | Bengtsson et al. | |
| 2003/0031271 A1 | 2/2003 | Bozeki et al. | |
| 2003/0062950 A1 | 4/2003 | Hamada et al. | |
| 2003/0137286 A1 | 7/2003 | Kimball et al. | |
| 2003/0146791 A1 | 8/2003 | Shvarts et al. | |
| 2003/0153289 A1 | 8/2003 | Hughes et al. | |
| 2003/0198063 A1 | 10/2003 | Smyth | |
| 2003/0206603 A1 | 11/2003 | Husted | |
| 2003/0220953 A1 | 11/2003 | Allred | |
| 2003/0232622 A1 | 12/2003 | Seo et al. | |

(56) References Cited

U.S. PATENT DOCUMENTS

| | | |
|---|---|---|
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| CN | 101201891 A | 6/2008 |
| CN | 101416385 A | 4/2009 |
| CN | 101867284 A | 10/2010 |
| EP | 0755121 A2 | 1/1997 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Lie, Donald Y.C. et al., "Highly Efficient and Linear Class E SiGe Power Amplifier Design," 8th International Conference on Solid-State and Integrated Circuit Technology (ICSIST), Oct. 23-26, 2006, pp. 1526-1529.

Non-Final Office Action for U.S. Appl. No. 13/367,973, mailed Sep. 24, 2013, 8 pages.

(56) References Cited

OTHER PUBLICATIONS

Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/602,856, mailed Sep. 24, 2013, 9 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Examination Report for European Patent Application No. 11720630.0 issued Mar. 18, 2014, 4 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Notice of Allowance for U.S. Appl. No. 12/836,307 mailed May 5, 2014, 6 pages.
Notice of Allowance for U.S. Appl. No. 13/188,024, mailed Jun. 18, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
International Preliminary Report on Patentability for PCT/US2012/024124, mailed Aug. 22, 2013, 8 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
International Preliminary Report on Patentability for PCT/US2012/023495, mailed Aug. 15, 2013, 10 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html? cmp_ids=71&news_ids=222901746.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm^2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Non-final Office Action for U.S. Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
Non-final Office Action for U.S. Appl. No. 12/112,006 mailed Apr. 5, 2010, 6 pages.

(56) References Cited

OTHER PUBLICATIONS

Notice of Allowance for U.S. Appl. No. 12/112,006 mailed Jul. 19, 2010, 6 pages.
Non-final Office Action for U.S. Appl. No. 13/089,917 mailed Nov. 23, 2012, 6 pages.
International Search Report for PCT/US11/033037, mailed Aug. 9, 2011, 10 pages.
International Preliminary Report on Patentability for PCT/US2011/033037 mailed Oct. 23, 2012, 7 pages.
Non-Final Office Action for U.S. Appl. No. 13/188,024, mailed Feb. 5, 2013, 8 pages.
International Search Report for PCT/US2011/044857, mailed Oct. 24, 2011, 10 pages.
International Preliminary Report on Patentability for PCT/US2011/044857 mailed Mar. 7, 2013, 6 pages.
Non-final Office Action for U.S. Appl. No. 13/218,400 mailed Nov. 8, 2012, 7 pages.
Notice of Allowance for U.S. Appl. No. 13/218,400 mailed Apr. 11, 2013, 7 pages.
International Search Report for PCT/US11/49243, mailed Dec. 22, 2011, 9 pages.
International Preliminary Report on Patentability for PCT/US11/49243 mailed Nov. 13, 2012, 33 pages.
International Search Report for PCT/US2011/054106 mailed Feb. 9, 2012, 11 pages.
International Search Report for PCT/US2011/061007 mailed Aug. 16, 2012, 16 pages.
Non-Final Office Action for U.S. Appl. No. 13/297,470 mailed May 8, 2013, 15 pages.
International Search Report for PCT/US2011/061009 mailed Feb. 8, 2012, 14 pages.
International Search Report for PCT/US2012/023495 mailed May 7, 2012, 13 pages.
Non-final Office Action for U.S. Appl. No. 13/222,453 mailed Dec. 6, 2012, 13 pages.
Notice of Allowance for U.S. Appl. No. 13/222,453 mailed Feb. 21, 2013, 7 pages.
Invitation to Pay Additional Fees and Where Applicable Protest Fee for PCT/US2012/024124 mailed Jun. 1, 2012, 7 pages.
International Search Report for PCT/US2012/024124 mailed Aug. 24, 2012, 14 pages.
Notice of Allowance for U.S. Appl. No. 13/316,229 mailed Nov. 14, 2012, 9 pages.
International Search Report for PCT/US2011/064255 mailed Apr. 3, 2012, 12 pages.
International Search Report for PCT/US2012/40317 mailed Sep. 7, 2012, 7 pages.
International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.

Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Non-Final Office Action for U.S. Appl. No. 13/486,012, mailed Jul. 28, 2014, 7 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/661,552, mailed Jun. 13, 2014, 5 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
Notice of Allowance for U.S. Appl. No. 13/684,826, mailed Jul. 18, 2014, 7 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
European Search Report for Patent Application No. 14162682.0, issued Aug. 27, 2014, 7 pages.
International Preliminary Report on Patentability and Written Opinion for PCT/US2012/067230, mailed Jun. 12, 2014, 7 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.

(56) References Cited

OTHER PUBLICATIONS

Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
First Office Action for Chinese Patent Application No. 201280026559.0, issued Nov. 3, 2014, 14 pages (with English translation).
Notice of Allowance for U.S. Appl. No. 13/948,291, mailed Feb. 11, 2015, 7 pages.
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
First Office Action for Chinese Patent Application No. 201180030273.5, issued Dec. 3, 2014, 15 pages (with English translation).
International Preliminary Report on Patentability for PCT/US2013/052277, mailed Feb. 5, 2015, 9 pages.
European Search Report for European Patent Application No. 14190851.7, issued Mar. 5, 2015, 6 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.

\* cited by examiner

US 9,024,688 B2

DUAL PARALLEL AMPLIFIER BASED DC-DC CONVERTER

RELATED APPLICATIONS

The present application claims priority to U.S. Provisional Patent Application No. 61/605,267, filed Mar. 1, 2012.

The present application claims priority to and is a continuation-in-part of U.S. patent application Ser. No. 13/661,552, filed Oct. 26, 2012, entitled "INDUCTANCE BASED PARALLEL AMPLIFIER PHASE COMPENSATION," now U.S. Pat. No. 8,878,606, which claims priority to U.S. Provisional Patent Applications No. 61/551,596, filed Oct. 26, 2011, and No. 61/562,493, filed Nov. 22, 2011.

All of the applications listed above are hereby incorporated herein by reference in their entireties.

FIELD OF THE DISCLOSURE

The present disclosure relates to direct current (DC)-DC converters and circuits that use DC-DC converters.

BACKGROUND

DC-DC converters often include switching power supplies, which may be based on switching at least one end of an energy storage element, such as an inductor, between a source of DC voltage and a ground. As a result, an output voltage from a DC-DC converter may have a ripple voltage resulting from the switching associated with the energy storage element. Typically, the ripple voltage is undesirable and is minimized as much as sizes and costs permit. Thus, there is a need to minimize ripple voltage using techniques that minimize sizes and costs.

SUMMARY

A direct current (DC)-DC converter, which includes switching circuitry, a first parallel amplifier, and a second parallel amplifier, is disclosed. The switching circuitry has +a switching circuitry output. The first parallel amplifier has a first feedback input and a first parallel amplifier output. The second parallel amplifier has a second feedback input and a second parallel amplifier output. A first inductive element is coupled between the switching circuitry output and the first feedback input. A second inductive element is coupled between the first feedback input and the second feedback input.

In one embodiment of the DC-DC converter, the first parallel amplifier partially provides a first power supply output signal via the first parallel amplifier output and the second inductive element based on a voltage setpoint. The second parallel amplifier partially provides the first power supply output signal via the second parallel amplifier output based on the voltage setpoint. The switching supply partially provides the first power supply output signal via the first inductive element and the second inductive element. The switching supply may provide power more efficiently than the first parallel amplifier and the second parallel amplifier. However, due to switching transients, ripple, and latency in the switching supply, the first parallel amplifier may at least partially provide a voltage of the first power supply output signal more accurately than the switching supply. Further, since the second inductive element is coupled between the first parallel amplifier output and the second parallel amplifier output, the second parallel amplifier is somewhat de-coupled from the ripple current of the first inductive element. As such, the second parallel amplifier may at least partially provide the voltage of the first power supply output signal more accurately than the first parallel amplifier due to bandwidth limitations of the first parallel amplifier. Further, by including the second inductive element, the second parallel amplifier may be significantly smaller than the first parallel amplifier, thereby having minimal impact on size, cost, and efficiency of the DC-DC converter.

In one embodiment of the DC-DC converter, the first parallel amplifier partially regulates the voltage of the first power supply output signal based on the voltage setpoint of the first power supply output signal, and the second parallel amplifier partially regulates the voltage of the first power supply output signal based on the voltage setpoint of the first power supply output signal. In this regard, an output current from the first parallel amplifier is used to drive the voltage of the first power supply output signal toward a desired voltage of the first power supply output signal. Further, an output current from the second parallel amplifier is used to drive the voltage of the first power supply output signal toward the desired voltage of the first power supply output signal. In this regard, in one embodiment of the DC-DC converter, the switching supply provides current to regulate the first power supply output signal to reduce the output current from the first parallel amplifier, to reduce the output current from the second parallel amplifier, or both, to increase efficiency of the DC-DC converter. In this regard, the first and the second parallel amplifiers may behave like voltage sources and the switching supply may behave like a current source.

In one embodiment of the DC-DC converter, the switching supply regulates the first power supply output signal to about minimize the output current from the first parallel amplifier. In an alternate embodiment of the DC-DC converter, the switching supply regulates the first power supply output signal to about minimize the output current from the second parallel amplifier. In an additional embodiment of the DC-DC converter, the switching supply regulates the first power supply output signal to reduce the output current from the first parallel amplifier and to reduce the output current from the second parallel amplifier.

In one embodiment of the DC-DC converter, the DC-DC converter functions as an envelope tracking power supply, which provides power to a radio frequency (RF) power amplifier (PA). As such, the first power supply output signal is a first envelope power supply signal. In envelope tracking systems, the first envelope power supply signal is amplitude modulated to track an envelope of an RF transmit signal provided by the RF PA. As RF communications protocols evolve, a bandwidth of the envelope of the RF transmit signal and a correlated bandwidth of the first envelope power supply signal tend to increase to support increasing data bandwidths. In this regard, the DC-DC converter must support such increasing bandwidths. Further, as RF communications protocols evolve, limits on out-of-band RF emissions may become increasingly stringent. Therefore, voltage accuracy of the first power supply output signal may become increasingly important.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A direct current (DC)-DC converter, which includes switching circuitry, a first parallel amplifier, and a second parallel amplifier, is disclosed. The switching circuitry has a switching circuitry output. The first parallel amplifier has a first feedback input and a first parallel amplifier output. The second parallel amplifier has a second feedback input and a second parallel amplifier output. A first inductive element is coupled between the switching circuitry output and the first feedback input. A second inductive element is coupled between the first feedback input and the second feedback input.

Figure 1:
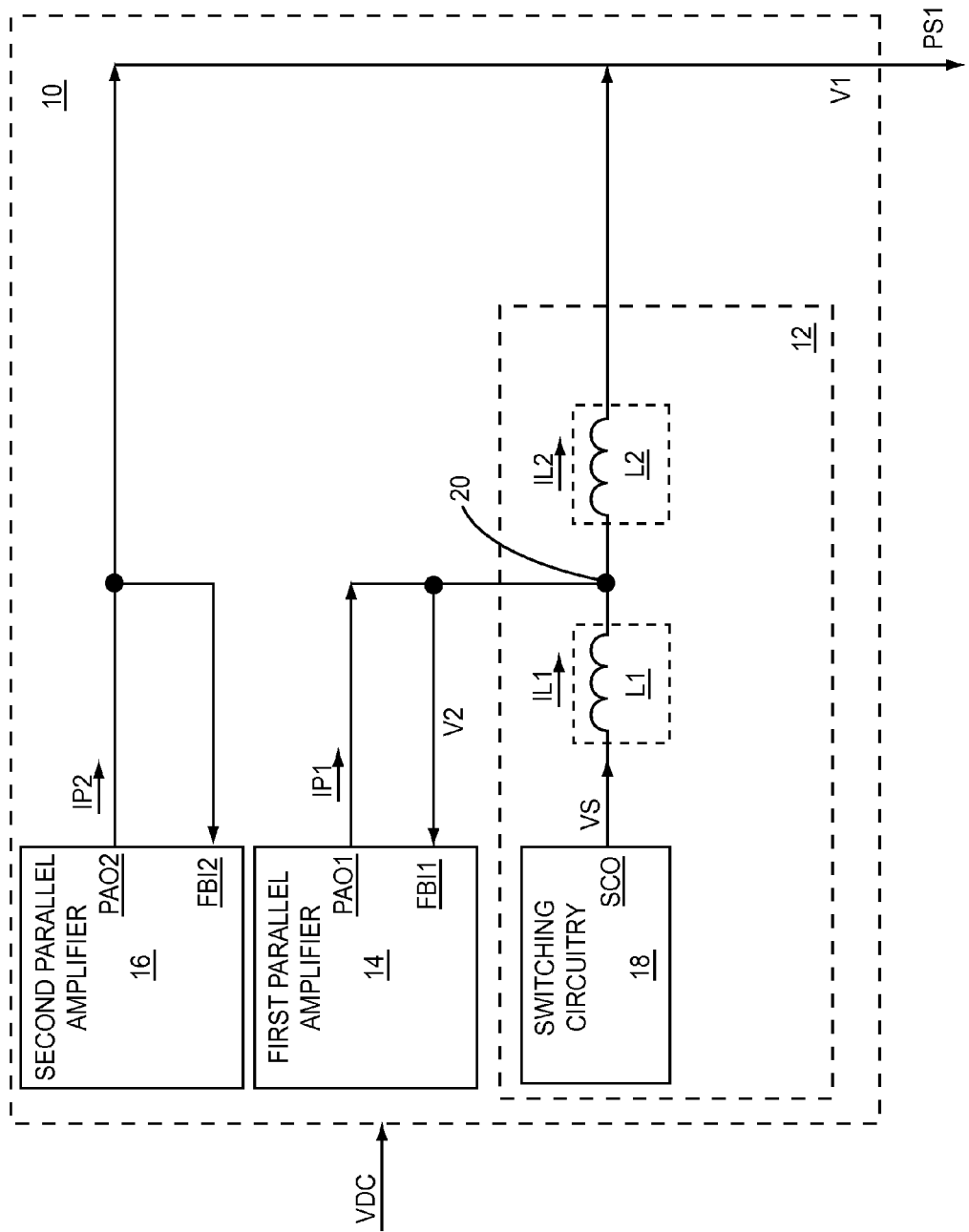
FIG. 1 shows a direct current (DC)-DC converter according to one embodiment of the present disclosure.

FIG. 1 shows a DC-DC converter 10 according to one embodiment of the present disclosure. The DC-DC converter 10 includes a switching supply 12, a first parallel amplifier 14, and a second parallel amplifier 16. The switching supply 12 includes switching circuitry 18, a first inductive element L1, and a second inductive element L2. In an alternate embodiment of the DC-DC converter 10, the first inductive element L1, the second inductive element L2, or both are provided externally to the DC-DC converter 10. The first parallel amplifier 14 has a first feedback input FBI1 and a first parallel amplifier output PAO1. The second parallel amplifier 16 has a second feedback input FBI2 and a second parallel amplifier output PAO2. The switching circuitry 18 has a switching circuitry output SCO.

The first inductive element L1 is coupled between the switching circuitry output SCO and the first feedback input FBI1. The second inductive element L2 is coupled between the first feedback input FBI1 and the second feedback input FBI2. The first feedback input FBI1 is coupled to the first parallel amplifier output PAO1. The second feedback input FBI2 is coupled to the second parallel amplifier output PAO2.

The first parallel amplifier 14 provides a first parallel amplifier output current IP1 via the first parallel amplifier output PAO1. The second parallel amplifier 16 provides a second parallel amplifier output current IP2 via the second parallel amplifier output PAO2. The switching circuitry 18 provides a switching output voltage VS via the switching circuitry output SCO. The first inductive element L1 has a first inductor current IL1 and a first inductance. The second inductive element L2 has a second inductor current 1L2 and a second inductance. In one embodiment of the switching supply 12, a first connection node 20 is provided where the first inductive element L1 and the second inductive element L2 are connected to one another. The first connection node 20 provides a second voltage V2 to the first parallel amplifier 14 via the first feedback input FBI1. In general, the first inductive element L1 and the second inductive element L2 are coupled to one another at the first connection node 20.

In one embodiment of the DC-DC converter 10, the first parallel amplifier 14 partially provides a first power supply output signal PS1 via the first parallel amplifier output PAO1 and the second inductive element L2 based on a voltage setpoint. The first power supply output signal PS1 has a first voltage V1. Further, the second parallel amplifier 16 partially provides the first power supply output signal PS1 via the second parallel amplifier output PAO2 based on the voltage setpoint. Additionally, the switching circuitry 18 partially provides the first power supply output signal PS1 via the first inductive element L1 and the second inductive element L2.

The switching circuitry 18 may provide power more efficiently than the first parallel amplifier 14 and the second parallel amplifier 16. However, due to switching transients, ripple, and latency in the switching circuitry 18, the first parallel amplifier 14 may at least partially provide the first voltage V1 more accurately than the switching circuitry 18. Further, since the second inductive element L2 is coupled between the first parallel amplifier output PAO1 and the second parallel amplifier output PAO2, the second parallel amplifier 16 is somewhat de-coupled from the ripple current of the first inductive element L1. As such, the second parallel amplifier 16 may at least partially provide the first voltage V1 more accurately than the first parallel amplifier 14 due to bandwidth limitations of the first parallel amplifier 14. Further, by including the second inductive element L2, the second parallel amplifier 16 may be significantly smaller than the first parallel amplifier 14, thereby having minimal impact on size, cost, and efficiency of the DC-DC converter 10.

In one embodiment of the first parallel amplifier 14 and the second parallel amplifier 16, a size of the first parallel amplifier 14 is at least two times greater than a size of the second parallel amplifier 16. In an alternate embodiment of the first parallel amplifier 14 and the second parallel amplifier 16, the size of the first parallel amplifier 14 is at least five times greater than the size of the second parallel amplifier 16. In an additional embodiment of the first parallel amplifier 14 and the second parallel amplifier 16, the size of the first parallel amplifier 14 is at least ten times greater than the size of the second parallel amplifier 16. In another embodiment of the first parallel amplifier 14 and the second parallel amplifier 16, the size of the first parallel amplifier 14 is at least twenty times greater than the size of the second parallel amplifier 16. In a further embodiment of the first parallel amplifier 14 and the second parallel amplifier 16, the size of the first parallel amplifier 14 is at least fifty times greater than the size of the second parallel amplifier 16. In a supplementary embodiment of the first parallel amplifier 14 and the second parallel amplifier 16, the size of the first parallel amplifier 14 is less than 100 times greater than the size of the second parallel amplifier 16.

In one embodiment of the first parallel amplifier 14 and the second parallel amplifier 16, a maximum output current from the first parallel amplifier 14 is at least two times greater than a maximum output current from the second parallel amplifier 16. In an alternate embodiment of the first parallel amplifier 14 and the second parallel amplifier 16, the maximum output current from the first parallel amplifier 14 is at least five times greater than the maximum output current from the second parallel amplifier 16. In an additional embodiment of the first parallel amplifier 14 and the second parallel amplifier 16, the maximum output current from the first parallel amplifier 14 is at least ten times greater than the maximum output current from the second parallel amplifier 16. In another embodiment of the first parallel amplifier 14 and the second parallel amplifier 16, the maximum output current from the first parallel amplifier 14 is at least twenty times greater than the maximum output current from the second parallel amplifier 16. In a further embodiment of the first parallel amplifier 14 and the second parallel amplifier 16, the maximum output current from the first parallel amplifier 14 is at least fifty times greater than the maximum output current from the second parallel amplifier 16. In a supplementary embodiment of the first parallel amplifier 14 and the second parallel amplifier 16, the maximum output current from the first parallel amplifier 14 is less than 100 times greater than the maximum output current from the second parallel amplifier 16.

In one embodiment of the first inductive element L1 and the second inductive element L2, the first inductance is at least two times greater than the second inductance. In an alternate embodiment of the first inductive element L1 and the second inductive element L2, the first inductance is at least three times greater than the second inductance. In an additional embodiment of the first inductive element L1 and the second inductive element L2, the first inductance is at least five times greater than the second inductance. In another embodiment of the first inductive element L1 and the second inductive element L2, the first inductance is at least ten times greater than the second inductance. In a further embodiment of the first inductive element L1 and the second inductive element L2, the first inductance is at least twenty times greater than the second inductance. In an exemplary embodiment of the first inductive element L1 and the second inductive element L2, the first inductance is equal to about 500 nano-henries and the second inductance is equal to about 100 nano-henries.

In one embodiment of the DC-DC converter 10, the first parallel amplifier 14 partially regulates the voltage, which is the first voltage V1, of the first power supply output signal PS1 based on the voltage setpoint of the first power supply output signal PS1. The second parallel amplifier 16 partially regulates the voltage of the first power supply output signal PS1 based on the voltage setpoint of the first power supply output signal PS1. In this regard, the output current, called the first parallel amplifier output current IP1, from the first parallel amplifier 14 is used to drive the voltage of the first power supply output signal PS1 toward a desired voltage of the first power supply output signal PS1. Further, the output current, called the second parallel amplifier output current IP2, from the second parallel amplifier 16 is used to drive the voltage of the first power supply output signal PS1 toward the desired voltage of the first power supply output signal PS1. In this regard, in one embodiment of the DC-DC converter 10, the switching circuitry 18 provides current to regulate the first power supply output signal PS1 to reduce the output current from the first parallel amplifier 14, to reduce the output current from the second parallel amplifier 16, or both, to increase efficiency of the DC-DC converter 10. In this regard, the first and the second parallel amplifiers 14, 16 may behave like voltage sources and the switching circuitry 18 may behave like a current source.

In one embodiment of the DC-DC converter 10, the switching circuitry 18 regulates the first power supply output signal PS1 to about minimize the output current from the first parallel amplifier 14. In an alternate embodiment of the DC-DC converter 10, the switching circuitry 18 regulates the first power supply output signal PS1 to about minimize the output current from the second parallel amplifier 16. In an additional embodiment of the DC-DC converter 10, the switching circuitry 18 regulates the first power supply output signal PS1 to reduce the output current from the first parallel amplifier 14 and to reduce the output current from the second parallel amplifier 16.

In one embodiment of the DC-DC converter 10, the DC-DC converter 10 receives a DC source signal VDC, such that the first parallel amplifier 14 partially provides the first power supply output signal PS1 using the DC source signal VDC, the second parallel amplifier 16 partially provides the first power supply output signal PS1 using the DC source signal VDC, and the switching circuitry 18 partially provides the first power supply output signal PS1 using the DC source signal VDC.

Figure 2:
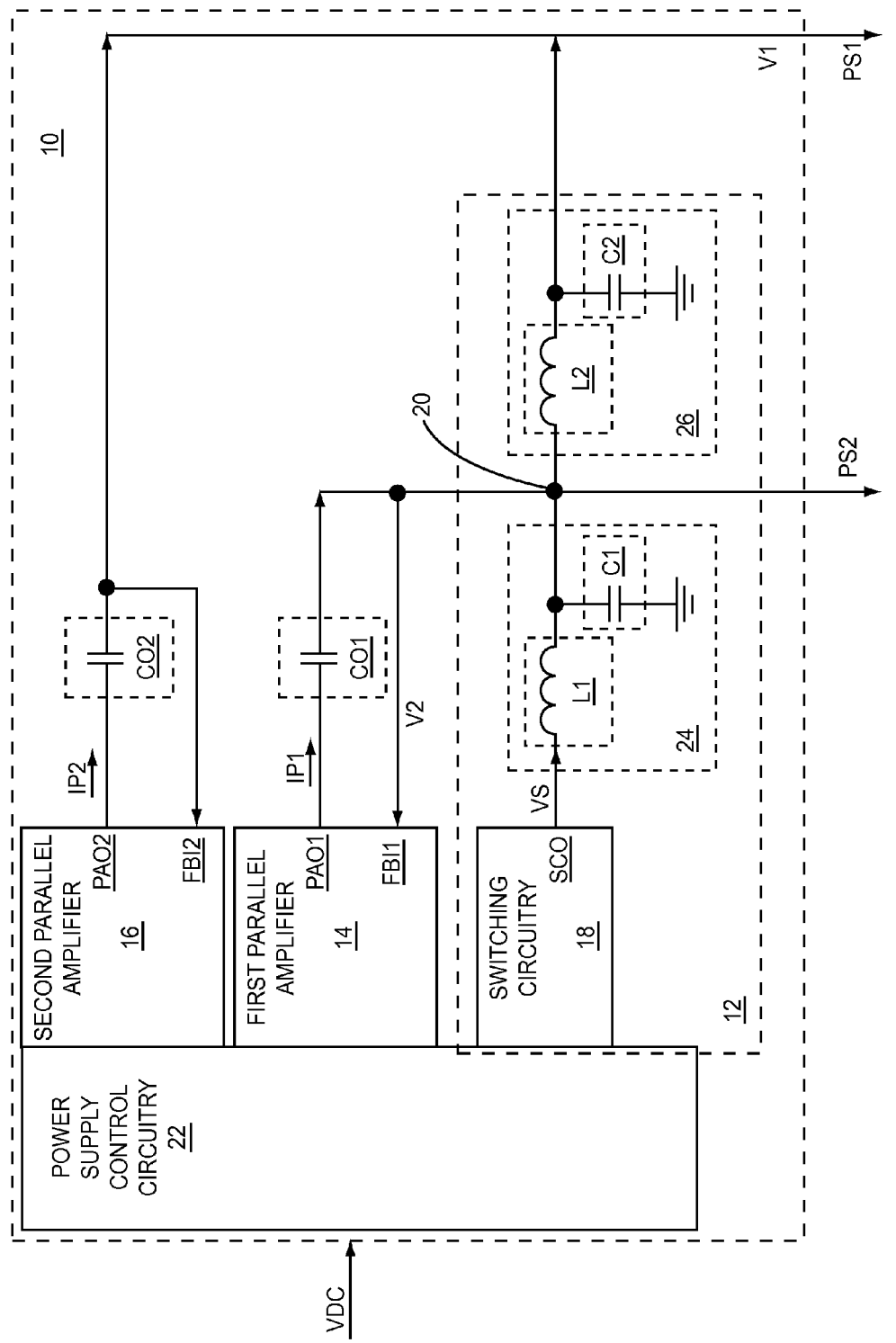
FIG. 2 shows the DC-DC converter according to an alternate embodiment of the DC-DC converter.

FIG. 2 shows the DC-DC converter 10 according to an alternate embodiment of the DC-DC converter 10. The DC-DC converter 10 illustrated in FIG. 2 is similar to the DC-DC converter 10 illustrated in FIG. 1, except the DC-DC converter 10 illustrated in FIG. 2 further includes power supply control circuitry 22, a first offset capacitive element CO1, and a second offset capacitive element CO2. Additionally, the switching supply 12 further includes a first low-pass filter 24 and a second low-pass filter 26. The first low-pass filter 24 includes the first inductive element L1 and a first filter capacitive element C1. The second low-pass filter 26 includes the second inductive element L2 and a second filter capacitive element C2.

The first offset capacitive element CO1 is coupled between the first parallel amplifier output PAO1 and the second inductive element L2, such that the first parallel amplifier 14 partially provides the first power supply output signal PS1 via the first parallel amplifier output PAO1, the first offset capacitive element CO1, and the second inductive element L2 based on the voltage setpoint. As such, the first offset capacitive element CO1 is coupled between the first feedback input FBI1 and the first parallel amplifier output PAO1. The first offset capacitive element CO1 allows the second voltage V2 to be higher than a voltage at the first parallel amplifier output PAO1. As a result, the first parallel amplifier 14 may at least partially regulate the first voltage V1 in a proper manner even if the second voltage V2 is greater than a maximum output voltage from the first parallel amplifier 14 at the first parallel amplifier output PAO1.

The second offset capacitive element CO2 is coupled between the second parallel amplifier output PAO2 and the second feedback input FBI2, such that the second parallel amplifier 16 partially provides the first power supply output signal PS1 via the second parallel amplifier output PAO2 and the second offset capacitive element CO2 based on the voltage setpoint. The second offset capacitive element CO2 allows the first voltage V1 to be higher than a voltage at the second parallel amplifier output PAO2. As a result, the second parallel amplifier 16 may at least partially regulate the first voltage V1 in a proper manner even if the first voltage V1 is greater than a maximum output voltage from the second parallel amplifier 16 at the second parallel amplifier output PAO2.

The power supply control circuitry 22 receives the DC source signal VDC and is coupled to the first parallel amplifier 14, the second parallel amplifier 16, and the switching circuitry 18. The first inductive element L1 and the second inductive element L2 provide a second power supply output signal PS2 via the first connection node 20. The first filter capacitive element C1 is coupled between the first connection node 20 and a ground. The first inductive element L1 is coupled between the switching circuitry output SCO and the first connection node 20. The second filter capacitive element C2 is coupled between a first end of the second inductive element L2 and the ground. A second end of the second inductive element L2 is coupled to the first connection node 20.

In general, the first filter capacitive element C1 is coupled between the first parallel amplifier output PAO1 and the ground. In the embodiment of the DC-DC converter 10 illustrated in FIG. 2, the first filter capacitive element C1 is coupled between the first parallel amplifier output PAO1 and the ground through the first offset capacitive element CO1. In an alternate embodiment of the DC-DC converter 10, the first offset capacitive element CO1 is omitted, such that the first filter capacitive element C1 is directly coupled between the first parallel amplifier output PAO1 and the ground. The first inductive element L1 and the first filter capacitive element C1 form the first low-pass filter 24 having a first cutoff frequency. The second inductive element L2 and the second filter capacitive element C2 form the second low-pass filter 26 having a second cutoff frequency. The second cutoff frequency may be significantly higher than the first cutoff frequency. As such, the first low-pass filter 24 may be used primarily to filter the switching output voltage VS, which is typically a square wave. However, the second low-pass filter 26 may be used to target specific high frequencies, such as certain harmonics of the switching output voltage VS.

In a first embodiment of the first low-pass filter 24 and the second low-pass filter 26, the second cutoff frequency is at least 10 times greater than the first cutoff frequency. In a second embodiment of the first low-pass filter 24 and the second low-pass filter 26, the second cutoff frequency is at least 20 times greater than the first cutoff frequency. In a third embodiment of the first low-pass filter 24 and the second low-pass filter 26, the second cutoff frequency is at least 50 times greater than the first cutoff frequency. In a fourth embodiment of the first low-pass filter 24 and the second low-pass filter 26, the second cutoff frequency is at least 100 times greater than the first cutoff frequency. In a fifth embodiment of the first low-pass filter 24 and the second low-pass filter 26, the second cutoff frequency is at least 200 times greater than the first cutoff frequency. In a sixth embodiment of the first low-pass filter 24 and the second low-pass filter 26, the second cutoff frequency is at least 500 times greater than the first cutoff frequency. In a seventh embodiment of the first low-pass filter 24 and the second low-pass filter 26, the second cutoff frequency is at least 1000 times greater than the first cutoff frequency. In an eighth embodiment of the first low-pass filter 24 and the second low-pass filter 26, the second cutoff frequency is equal to about 1000 times than the first cutoff frequency. In a ninth embodiment of the first low-pass filter 24 and the second low-pass filter 26, the second cutoff frequency is less than about 10,000 times than the first cutoff frequency.

Figure 3:
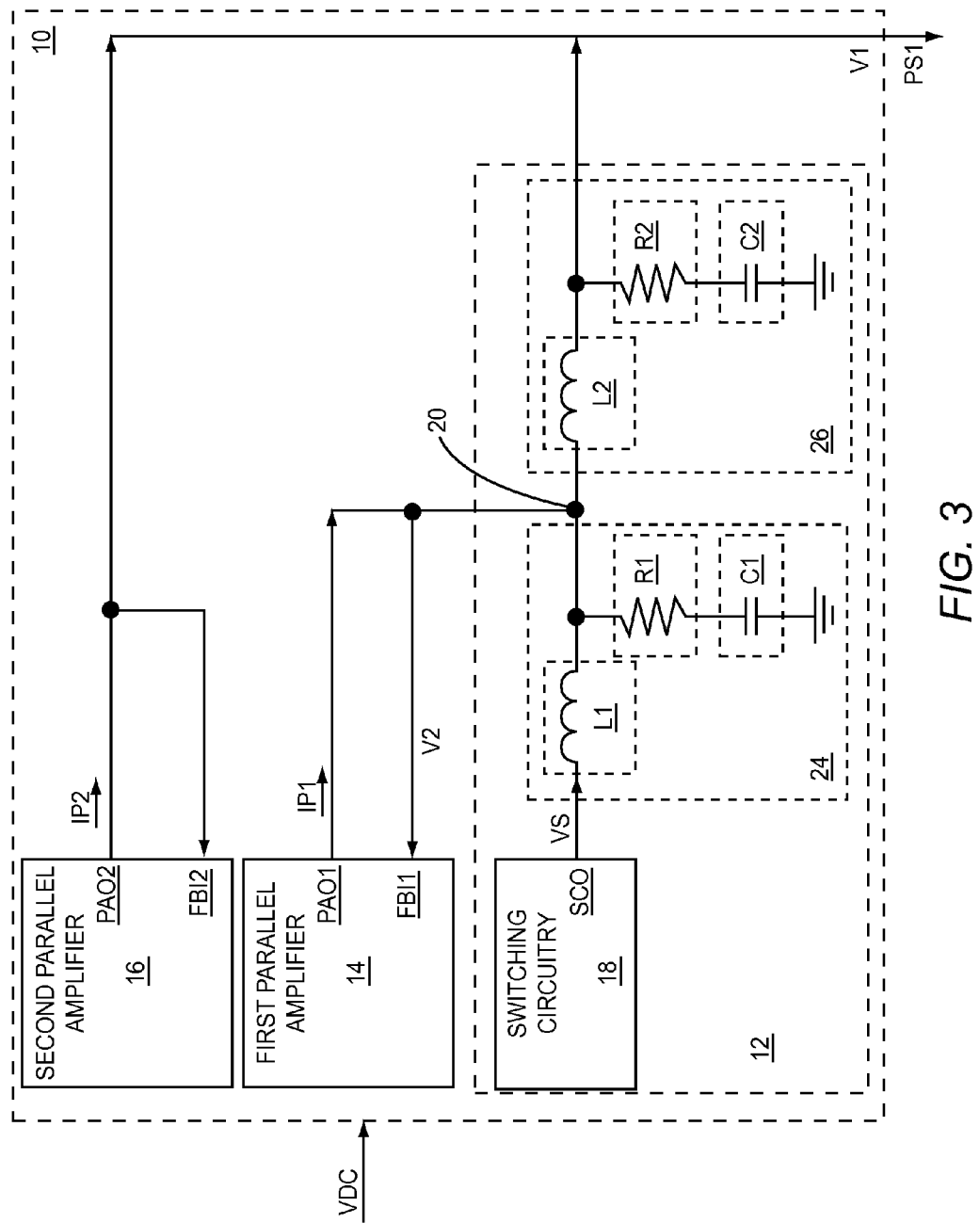
FIG. 3 shows the DC-DC converter according to an additional embodiment of the DC-DC converter.

FIG. 3 shows the DC-DC converter 10 according to an additional embodiment of the DC-DC converter 10. The DC-DC converter 10 illustrated in FIG. 3 is similar to the DC-DC converter 10 illustrated in FIG. 2, except in the DC-DC converter 10 illustrated in FIG. 3, the first offset capacitive element CO1 and the second offset capacitive element CO2 are omitted. Additionally, the first low-pass filter 24 further includes a first resistive element R1 and the second low-pass filter 26 further includes a second resistive element R2. The first resistive element R1 and the first filter capacitive element C1 are coupled in series between the first connection node 20 and the ground. The second resistive element R2 and the second filter capacitive element C2 are coupled in series between the first end of the second inductive element L2 and the ground. The second end of the second inductive element L2 is coupled to the first connection node 20. By adding the first resistive element R1 and the second resistive element R2, Q Factors of the first low-pass filter 24 and the second low-pass filter 26 may be reduced, respectively.

Figure 4:
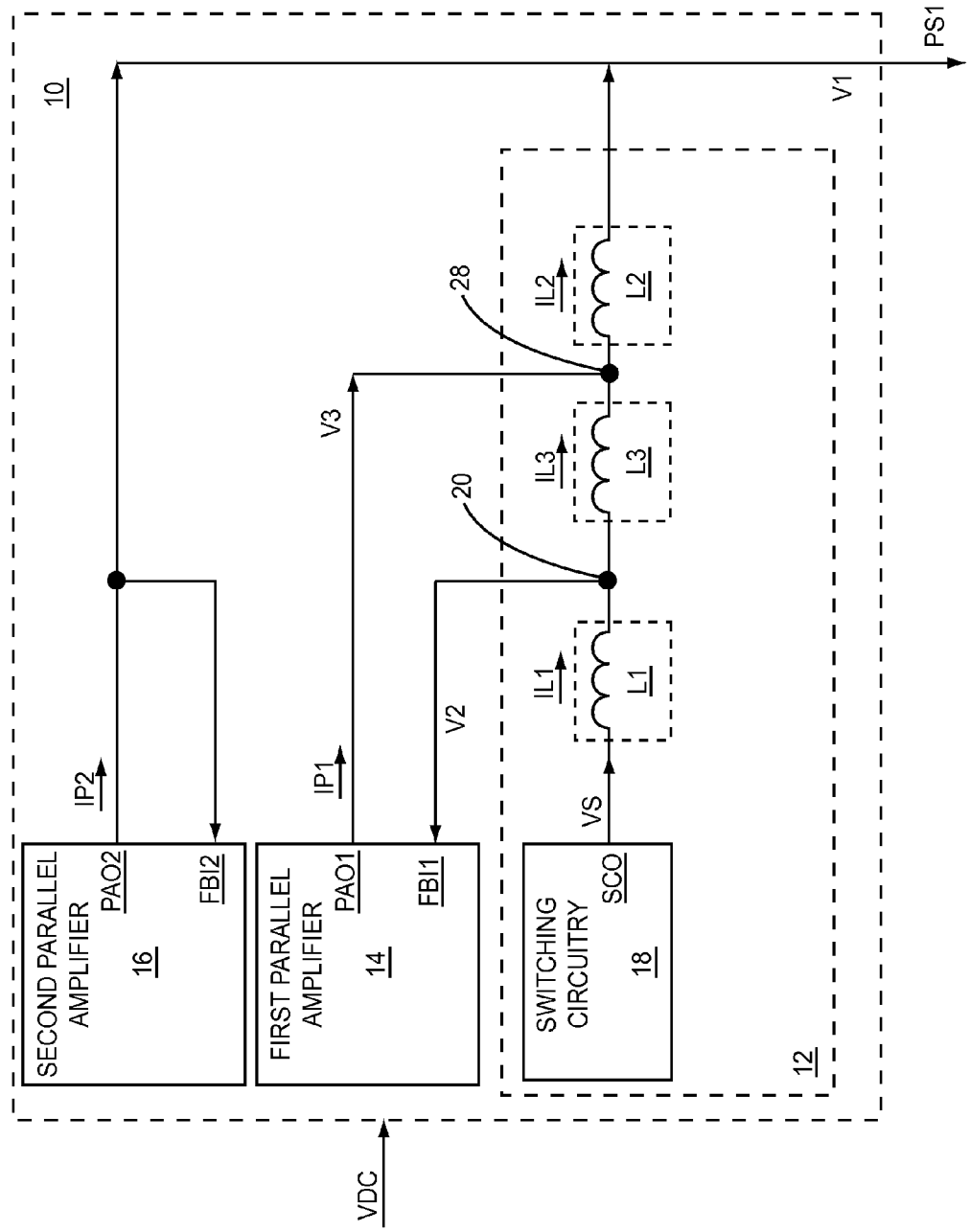
FIG. 4 shows the DC-DC converter according to another embodiment of the DC-DC converter.

FIG. 4 shows the DC-DC converter 10 according to another embodiment of the DC-DC converter 10. The DC-DC converter 10 illustrated in FIG. 4 is similar to the DC-DC converter 10 illustrated in FIG. 1, except in the DC-DC converter 10 illustrated in FIG. 4, the switching supply 12 further includes a third inductive element L3 coupled between the first parallel amplifier output PAO1 and the first feedback input FBI1. As such, the second inductive element L2 and the third inductive element L3 are coupled in series between the first feedback input FBI1 and the second feedback input FBI2. In one embodiment of the switching supply 12, a second connection node 28 is provided where the third inductive element L3 and the second inductive element L2 are connected to one another. The first parallel amplifier 14 provides the first parallel amplifier output current IP1 and a third voltage V3 to the second connection node 28 via the first parallel amplifier output PAO1. The third inductive element L3 has a third inductor current IL3.

Further, in one embodiment of the first parallel amplifier 14, the first parallel amplifier 14 has a limited open loop gain at high frequencies that are above a first frequency threshold. At such frequencies, a group delay in the first parallel amplifier 14 may normally limit the ability of the first parallel amplifier 14 to accurately partially regulate the first voltage V1 of the first power supply output signal PS1. However, by feeding back the second voltage V2 to the first feedback input FBI1, a phase-shift that is developed across the third inductive element L3 at least partially compensates for the limited open loop gain of the first parallel amplifier 14 at frequencies that are above the first frequency threshold, thereby improving the ability of the first parallel amplifier 14 to accurately partially regulate the first voltage V1. In this regard, in one embodiment of the DC-DC converter 10, the first parallel amplifier 14 partially provides the first power supply output signal PS1 via the first parallel amplifier output PAO1 based on the voltage setpoint and feeding back a voltage to the first feedback input FBI1 from the first connection node 20 between the first inductive element L1 and the third inductive element L3.

The first inductive element L1 has the first inductance and the third inductive element L3 has a third inductance. In a first embodiment of the first inductive element L1 and the third inductive element L3, a magnitude of the first inductance is at least 10 times greater than a magnitude of the third inductance. In a second embodiment of the first inductive element L1 and the third inductive element L3, a magnitude of the first inductance is at least 100 times greater than a magnitude of the third inductance. In a third embodiment of the first inductive element L1 and the third inductive element L3, a magnitude of the first inductance is at least 500 times greater than a magnitude of the third inductance. In a fourth embodiment of the first inductive element L1 and the third inductive element L3, a magnitude of the first inductance is at least 1000 times greater than a magnitude of the third inductance. In a fifth embodiment of the first inductive element L1 and the third inductive element L3, a magnitude of the first inductance is less than 1000 times greater than a magnitude of the third inductance. In a sixth embodiment of the first inductive element L1 and the third inductive element L3, a magnitude of the first inductance is less than 5000 times greater than a magnitude of the third inductance.

Figure 5:
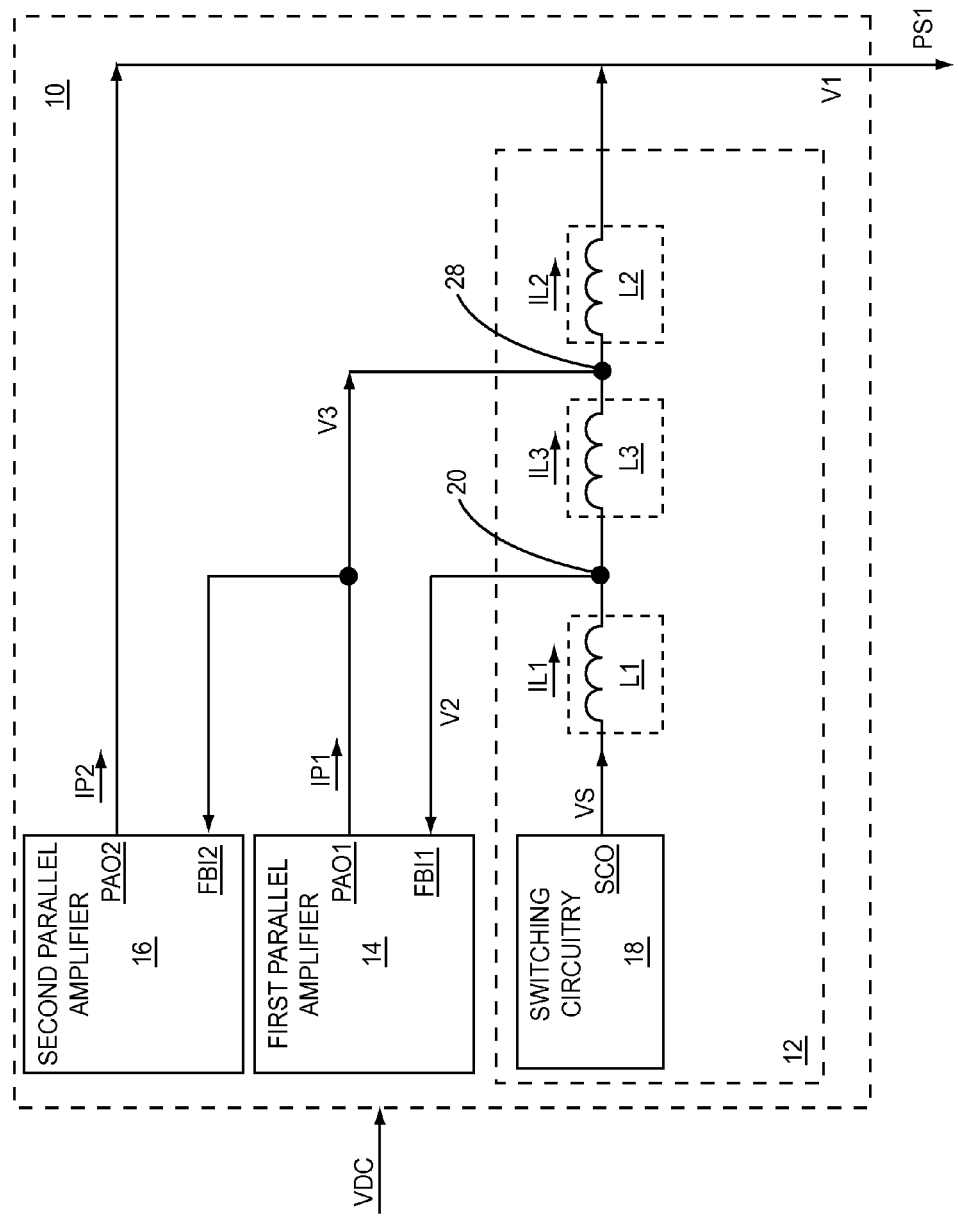
FIG. 5 shows the DC-DC converter according to a further embodiment of the DC-DC converter.

FIG. 5 shows the DC-DC converter 10 according to a further embodiment of the DC-DC converter 10. The DC-DC converter 10 illustrated in FIG. 5 is similar to the DC-DC converter 10 illustrated in FIG. 4, except in the DC-DC converter 10 illustrated in FIG. 5, the second feedback input FBI2 is coupled to the second connection node 28 instead of being coupled to the second parallel amplifier output PAO2. As such, a phase-shift across the second inductive element L2 at least partially compensates for limited open loop gain of the second parallel amplifier 16 at frequencies above a second frequency threshold.

Figure 6:
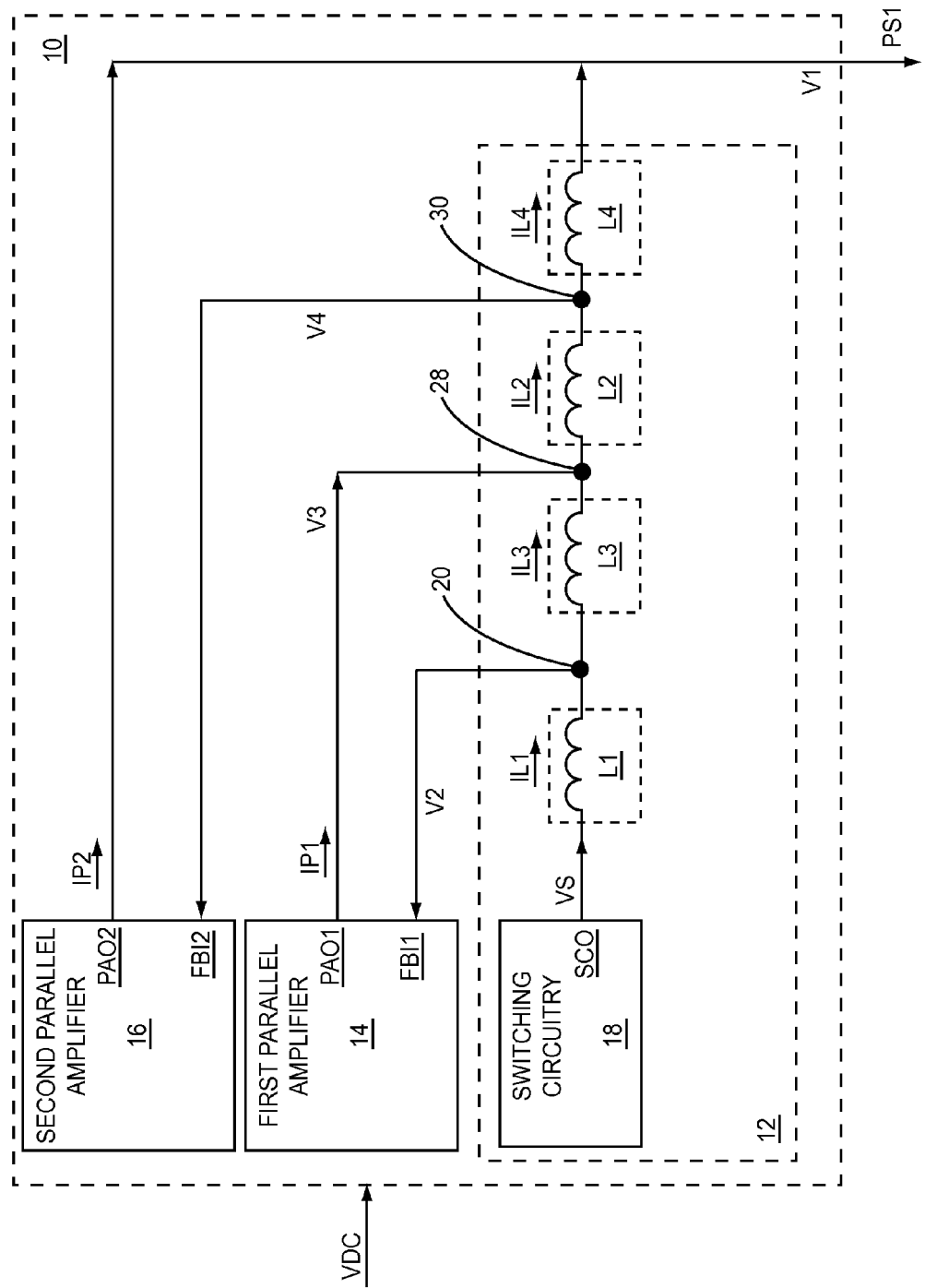
FIG. 6 shows the DC-DC converter according to a supplemental embodiment of the DC-DC converter.

FIG. 6 shows the DC-DC converter 10 according to a supplemental embodiment of the DC-DC converter 10. The DC-DC converter 10 illustrated in FIG. 6 is similar to the DC-DC converter 10 illustrated in FIG. 4, except in the DC-DC converter 10 illustrated in FIG. 6, the switching supply 12 further includes a fourth inductive element L4 coupled between the second parallel amplifier output PAO2 and the second feedback input FBI2. As such, the second inductive element L2 and the fourth inductive element L4 are coupled in series between the first parallel amplifier output PAO1 and the second parallel amplifier output PAO2. In one embodiment of the switching supply 12, a third connection node 30 is provided where the fourth inductive element L4 and the second inductive element L2 are connected to one another. The fourth inductive element L4 and the second inductive element L2 provide a fourth voltage V4 to the second feedback input FBI2 via the third connection node 30. The fourth inductive element L4 has a fourth inductor current IL4.

Further, in one embodiment of the second parallel amplifier 16, the second parallel amplifier 16 has a limited open loop gain at high frequencies that are above a second frequency threshold. At such frequencies, a group delay in the second parallel amplifier 16 may normally limit the ability of the second parallel amplifier 16 to accurately partially regulate the first voltage V1 of the first power supply output signal PS1. However, by feeding back the fourth voltage V4 to the second feedback input FBI2, a phase-shift that is developed across the fourth inductive element L4 at least partially compensates for the limited open loop gain of the second parallel amplifier 16 at frequencies that are above the second frequency threshold, thereby improving the ability of the second parallel amplifier 16 to accurately partially regulate the first voltage V1. In this regard, in one embodiment of the DC-DC converter 10, the second parallel amplifier 16 partially provides the first power supply output signal PS1 via the second parallel amplifier output PAO2 based on the voltage setpoint and feeding back a voltage to the second feedback input FBI2 from the third connection node 30 between the second inductive element L2 and the fourth inductive element L4.

The second inductive element L2 has the second inductance and the fourth inductive element L4 has a fourth inductance. In a first embodiment of the second inductive element L2 and the fourth inductive element L4, a magnitude of the second inductance is at least 10 times greater than a magnitude of the fourth inductance. In a second embodiment of the second inductive element L2 and the fourth inductive element L4, a magnitude of the second inductance is at least 100 times greater than a magnitude of the fourth inductance. In a third embodiment of the second inductive element L2 and the fourth inductive element L4, a magnitude of the second inductance is at least 500 times greater than a magnitude of the fourth inductance. In a fourth embodiment of the second inductive element L2 and the fourth inductive element L4, a magnitude of the second inductance is at least 1000 times greater than a magnitude of the fourth inductance. In a fifth embodiment of the second inductive element L2 and the fourth inductive element L4, a magnitude of the second inductance is less than 1000 times greater than a magnitude of the fourth inductance. In a sixth embodiment of the second inductive element L2 and the fourth inductive element L4, a magnitude of the second inductance is less than 5000 times greater than a magnitude of the fourth inductance.

Figure 7:
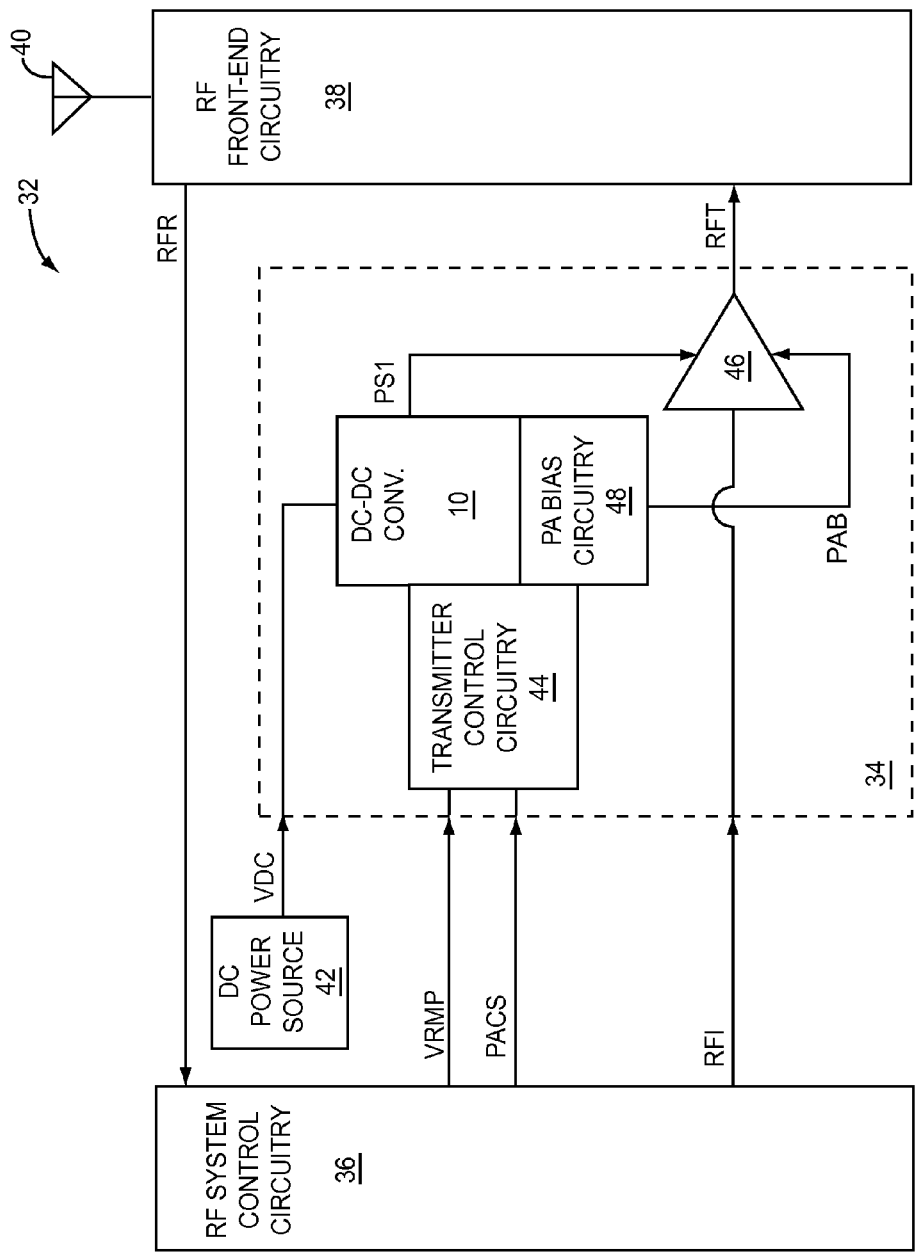
FIG. 7 shows a radio frequency (RF) communications system according to one embodiment of the present disclosure.

FIG. 7 shows a radio frequency (RF) communications system 32 according to one embodiment of the present disclosure. The RF communications system 32 includes RF transmitter circuitry 34, RF system control circuitry 36, RF front-end circuitry 38, an RF antenna 40, and a DC power source 42. The RF transmitter circuitry 34 includes transmitter control circuitry 44, an RF power amplifier (PA) 46, the DC-DC converter 10, and PA bias circuitry 48. In an alternate embodiment of the RF communications system 32, the DC power source 42 is external to the RF communications system 32.

In one embodiment of the DC-DC converter 10, the DC-DC converter 10 functions as an envelope tracking power supply, which provides power to the RF PA 46. As such, the first power supply output signal PS1 is a first envelope power supply signal. In envelope tracking systems, the first envelope power supply signal is amplitude modulated to track an envelope of an RF transmit signal RFT provided by the RF PA 46. As RF communications protocols evolve, a bandwidth of the envelope of the RF transmit signal RFT and a correlated bandwidth of the first envelope power supply signal tend to increase to support increasing data bandwidths. In this regard, the DC-DC converter 10 must support such increasing bandwidths. Further, as RF communications protocols evolve, limits on out-of-band RF emissions may become increasingly stringent. Therefore, voltage accuracy of the first power supply output signal PS1 may become increasingly important.

In one embodiment of the RF communications system 32, the RF front-end circuitry 38 receives via the RF antenna 40, processes, and forwards an RF receive signal RFR to the RF system control circuitry 36. The RF system control circuitry 36 provides a power supply control signal VRMP and a transmitter configuration signal PACS to the transmitter control circuitry 44. The RF system control circuitry 36 provides an RF input signal RFI to the RF PA 46. The DC power source 42 provides the DC source signal VDC to the DC-DC converter 10. Specifically, the DC power source 42 provides the DC source signal VDC to the switching circuitry 18 (FIG. 1), the first parallel amplifier 14 (FIG. 1), and the second parallel amplifier 16 (FIG. 1). In one embodiment of the DC power source 42, the DC power source 42 is a battery. In one embodiment of the power supply control signal VRMP, the power supply control signal VRMP is an envelope power supply control signal.

The transmitter control circuitry 44 is coupled to the DC-DC converter 10 and to the PA bias circuitry 48. The DC-DC converter 10 provides the first power supply output signal PS1 to the RF PA 46 based on the power supply control signal VRMP. Specifically, the voltage setpoint of the first power supply output signal PS1 is based on the power supply control signal VRMP. As such, the first power supply output signal PS1 is a first envelope power supply signal. The DC source signal VDC provides power to the DC-DC converter 10. As such, the first power supply output signal PS1 is based on the DC source signal VDC.

The power supply control signal VRMP is representative of the voltage setpoint of the first power supply output signal PS1. As such, the voltage setpoint is based on the power supply control signal VRMP. The RF PA 46 receives and amplifies the RF input signal RFI to provide the RF transmit signal RFT using the first envelope power supply signal, which is the first power supply output signal PS1. The first envelope power supply signal provides power for amplification to the RF PA 46. The RF front-end circuitry 38 receives, processes, and transmits the RF transmit signal RFT via the RF antenna 40. In one embodiment of the RF transmitter circuitry 34, the transmitter control circuitry 44 configures the RF transmitter circuitry 34 based on the transmitter configuration signal PACS.

The PA bias circuitry 48 provides a PA bias signal PAB to the RF PA 46. In this regard, the PA bias circuitry 48 biases the RF PA 46 via the PA bias signal PAB. In one embodiment of the PA bias circuitry 48, the PA bias circuitry 48 biases the RF PA 46 based on the transmitter configuration signal PACS. In one embodiment of the RF front-end circuitry 38, the RF front-end circuitry 38 includes at least one RF switch, at least one RF amplifier, at least one RF filter, at least one RF duplexer, at least one RF diplexer, at least one RF amplifier, the like, or any combination thereof. In one embodiment of the RF system control circuitry 36, the RF system control circuitry 36 is RF transceiver circuitry, which may include an RF transceiver IC, baseband controller circuitry, the like, or any combination thereof. In one embodiment of the RF transmitter circuitry 34, the first envelope power supply signal provides power for amplification and envelope tracks the RF transmit signal RFT.

Figure 8:
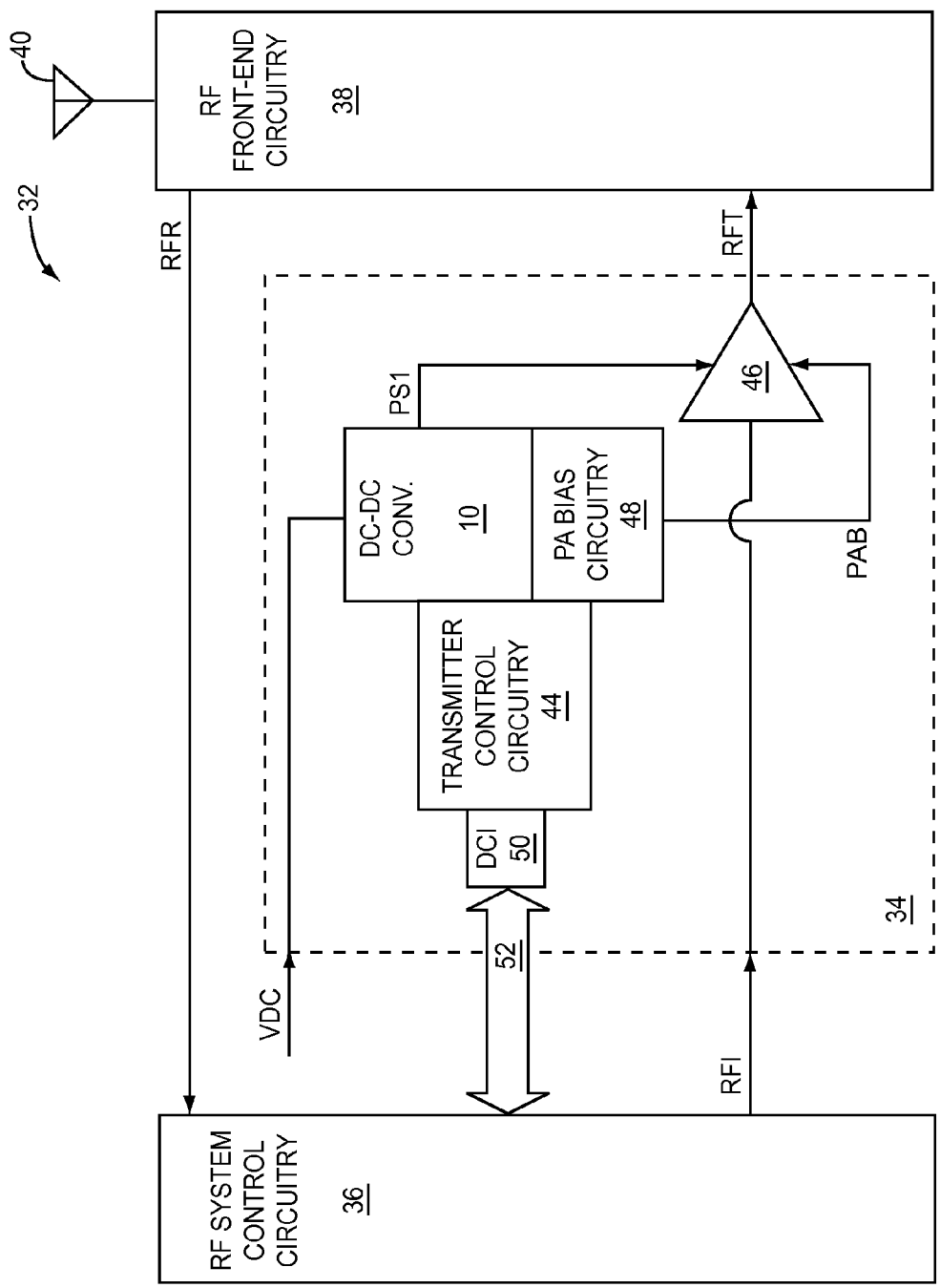
FIG. 8 shows the RF communications system according to an alternate embodiment of the RF communications system.

FIG. 8 shows the RF communications system 32 according to an alternate embodiment of the RF communications system 32. The RF communications system 32 illustrated in FIG. 8 is similar to the RF communications system 32 illustrated in FIG. 7, except in the RF communications system 32 illustrated in FIG. 8, the RF transmitter circuitry 34 further includes a digital communications interface 50, which is coupled between the transmitter control circuitry 44 and a digital communications bus 52. The digital communications bus 52 is also coupled to the RF system control circuitry 36. As such, the RF system control circuitry 36 provides the power supply control signal VRMP (FIG. 7) and the transmitter configuration signal PACS (FIG. 7) to the transmitter control circuitry 44 via the digital communications bus 52 and the digital communications interface 50.

Figure 9:
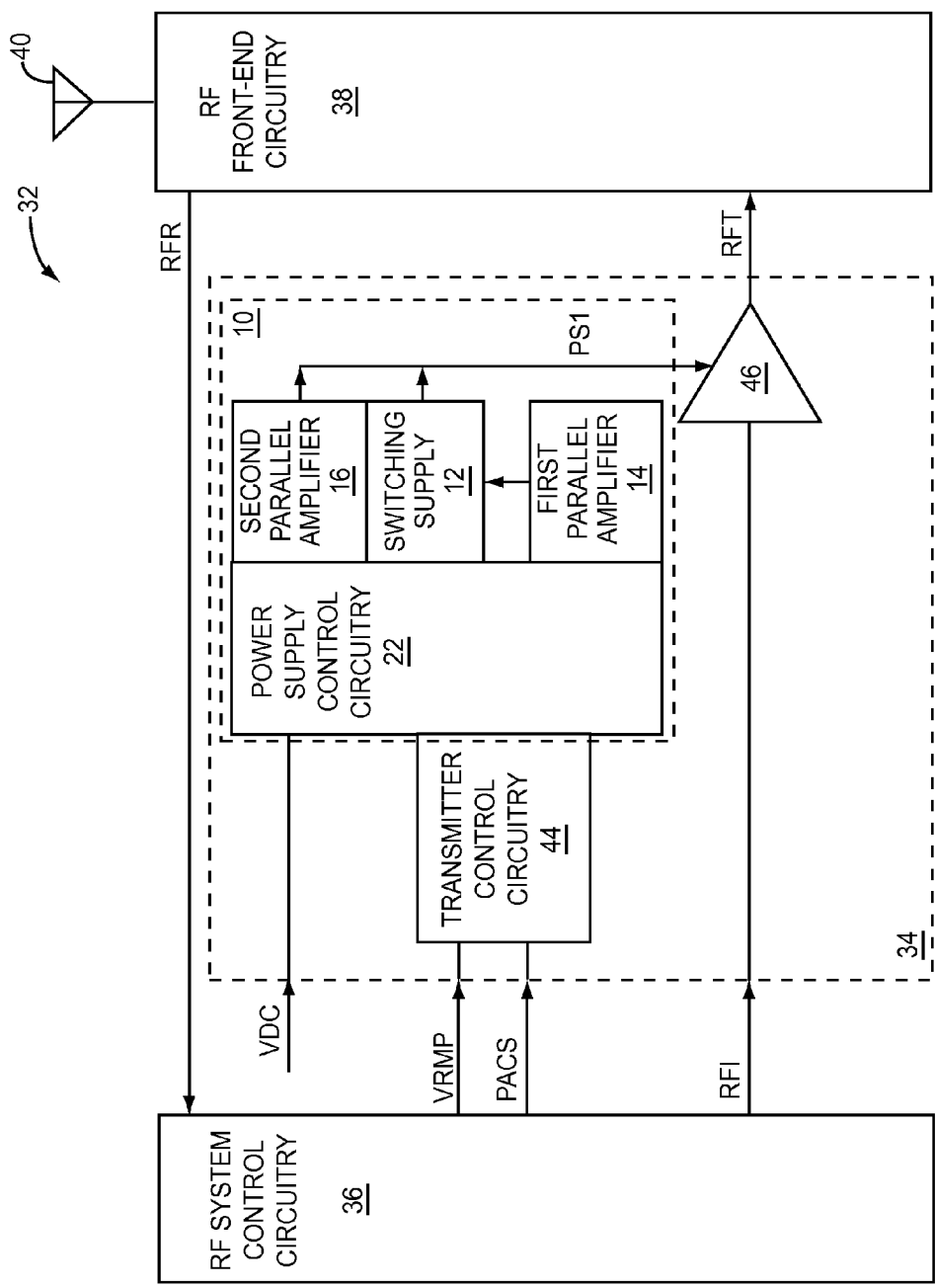
FIG. 9 shows the RF communications system according to an additional embodiment of the RF communications system.

FIG. 9 shows details of the DC-DC converter 10 illustrated in FIG. 7 according to one embodiment of the DC-DC converter 10. The DC-DC converter 10 includes the power supply control circuitry 22, the first parallel amplifier 14, the second parallel amplifier 16, and the switching supply 12. The power supply control circuitry 22 controls the first parallel amplifier 14, the second parallel amplifier 16, and the switching supply 12. Each of the first parallel amplifier 14, the second parallel amplifier 16, and the switching supply 12 at least partially provides the first power supply output signal PS1.

Figure 10:
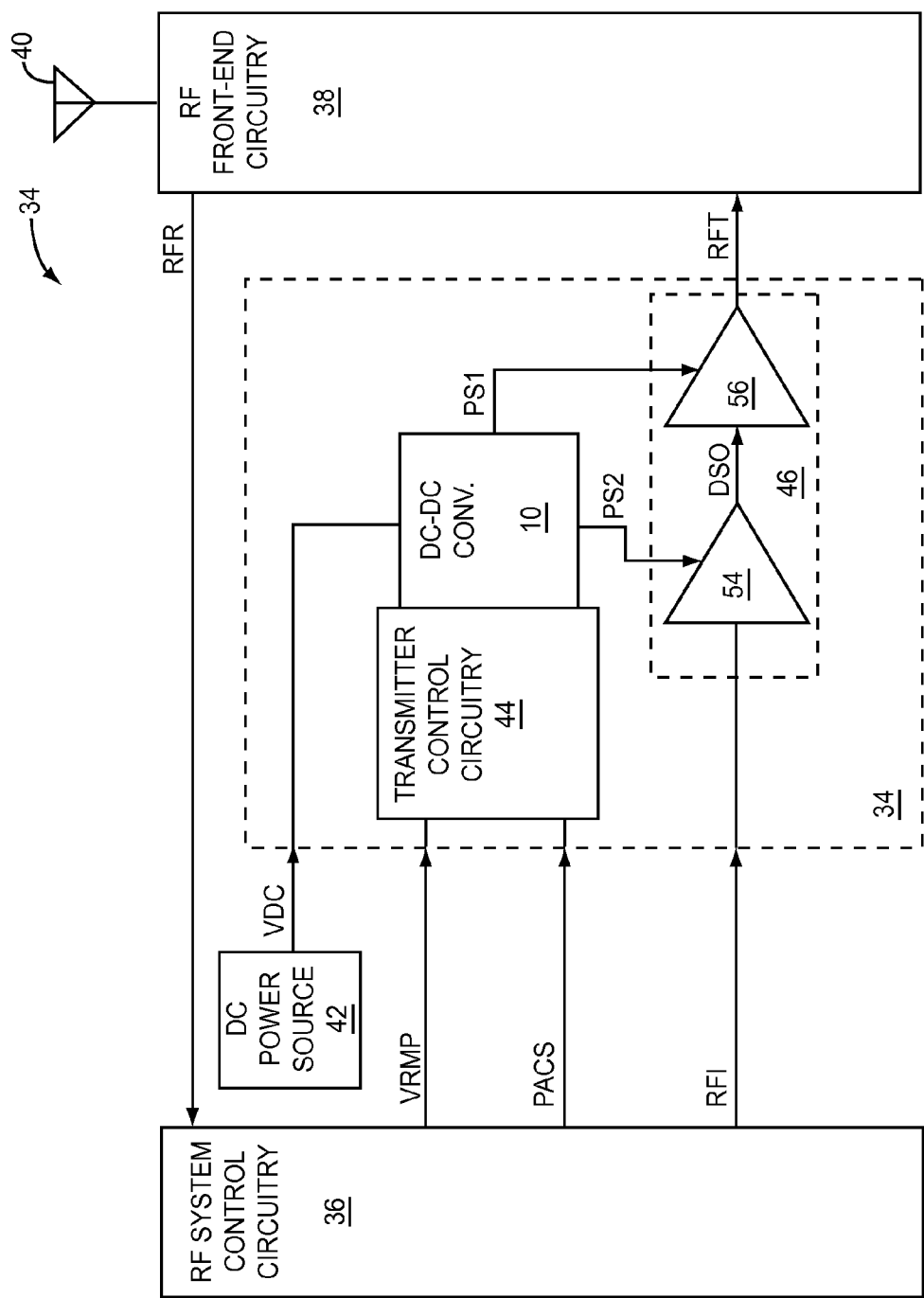
FIG. 10 shows the RF communications system according to another embodiment of the RF communications system.

FIG. 10 shows the RF communications system 32 according to another embodiment of the RF communications system 32. The RF communications system 32 illustrated in FIG. 10 is similar to the RF communications system 32 illustrated in FIG. 7, except in the RF communications system 32 illustrated in FIG. 10, the PA bias circuitry 48 (FIG. 7) is not shown and the RF PA 46 includes a driver stage 54 and a final stage 56, which is coupled to the driver stage 54. The DC-DC converter 10 provides the second power supply output signal PS2, which is a second envelope power supply signal, to the driver stage 54 based on the power supply control signal VRMP. Further, the DC-DC converter 10 provides the first power supply output signal PS1, which is the first envelope power supply signal, to the final stage 56 based on the power supply control signal VRMP. The driver stage 54 receives and amplifies the RF input signal RFI to provide a driver stage output signal DSO using the second envelope power supply signal, which provides power for amplification. Similarly, the final stage 56 receives and amplifies the driver stage output signal DSO to provide the RF transmit signal RFT using the first envelope power supply signal, which provides power for amplification.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
    switching circuitry having a switching circuitry output;
    a first parallel amplifier having a first feedback input and a first parallel amplifier output, such that a first inductive element is coupled between the switching circuitry output and the first feedback input; and the first parallel amplifier is configured to partially provide a first power supply output signal via the first parallel amplifier output and a second inductive element based on a voltage setpoint; and
    a second parallel amplifier having a second feedback input and a second parallel amplifier output, such that the second inductive element is coupled between the first feedback input and the second feedback input.

2. The circuitry of claim 1 further comprising the first inductive element and the second inductive element.

3. The circuitry of claim 1 wherein the first feedback input is coupled to the first parallel amplifier output and the second feedback input is coupled to the second parallel amplifier output.

4. The circuitry of claim 1 wherein:
    the second parallel amplifier is adapted to partially provide the first power supply output signal via the second parallel amplifier output based on the voltage setpoint; and
    the switching circuitry is adapted to partially provide the first power supply output signal via the first inductive element and the second inductive element.

5. The circuitry of claim 4 wherein a maximum output current from the first parallel amplifier is at least ten times greater than a maximum output current from the second parallel amplifier.

6. The circuitry of claim 4 wherein the voltage setpoint is based on a power supply control signal.

7. The circuitry of claim 4 wherein:
the first parallel amplifier is further adapted to partially regulate a voltage of the first power supply output signal based on the voltage setpoint;
the second parallel amplifier is further adapted to partially regulate the voltage of the first power supply output signal based on the voltage setpoint; and
the switching circuitry is further adapted to regulate the first power supply output signal to about minimize an output current from the first parallel amplifier.

8. The circuitry of claim 4 further comprising a radio frequency (RF) power amplifier (PA), wherein:
the first power supply output signal is a first envelope power supply signal; and
the RF PA is adapted to receive and amplify an RF input signal to provide an RF transmit signal using the first envelope power supply signal.

9. The circuitry of claim 8 wherein the first envelope power supply signal provides power for amplification to the RF PA.

10. The circuitry of claim 8 wherein the RF PA comprises a final stage adapted to provide the RF transmit signal using the first envelope power supply signal.

11. The circuitry of claim 4 wherein:
a DC power source is adapted to provide a DC source signal to the first parallel amplifier, to the second parallel amplifier, and to the switching circuitry;
the first parallel amplifier is further adapted to partially provide the first power supply output signal using the DC source signal;
the second parallel amplifier is further adapted to partially provide the first power supply output signal using the DC source signal; and
the switching circuitry is further adapted to partially provide the first power supply output signal using the DC source signal.

12. The circuitry of claim 11 wherein the DC power source is a battery.

13. The circuitry of claim 11 further comprising the DC power source.

14. The circuitry of claim 4 wherein:
the first inductive element and the second inductive element are coupled to one another at a first connection node; and
the first inductive element and the second inductive element are adapted to provide a second power supply output signal via the first connection node.

15. The circuitry of claim 1 further comprising a first offset capacitive element and a second offset capacitive element wherein:
the first offset capacitive element is coupled between the first feedback input and the first parallel amplifier output; and
the second offset capacitive element is coupled between the second feedback input and the second parallel amplifier output.

16. The circuitry of claim 1 wherein the first inductive element has a first inductance and the second inductive element has a second inductance, such that a magnitude of the first inductance is at least three times greater than a magnitude of the second inductance.

17. The circuitry of claim 1 wherein a third inductive element is coupled between the first parallel amplifier output and the first feedback input.

18. Circuitry comprising:
switching circuitry having a switching circuitry output;
a first parallel amplifier having a first feedback input and a first parallel amplifier output, such that a first inductive element is coupled between the switching circuitry output and the first feedback input; and
a second parallel amplifier having a second feedback input and a second parallel amplifier output, such that a second inductive element is coupled between the first feedback input and the second feedback input, wherein:
a third inductive element is coupled between the first parallel amplifier output and the first feedback input;
the first parallel amplifier is adapted to partially provide a first power supply output signal via the first parallel amplifier output based on a voltage setpoint; and
a phase-shift across the third inductive element at least partially compensates for limited open loop gain of the first parallel amplifier at frequencies above a first frequency threshold.

19. Circuitry comprising:
switching circuitry having a switching circuitry output;
a first parallel amplifier having a first feedback input and a first parallel amplifier output, such that a first inductive element is coupled between the switching circuitry output and the first feedback input; and
a second parallel amplifier having a second feedback input and a second parallel amplifier output, such that a second inductive element is coupled between the first feedback input and the second feedback input, wherein:
a third inductive element is coupled between the first parallel amplifier output and the first feedback input; and
the first inductive element has a first inductance, the second inductive element has a second inductance, and the third inductive element has a third inductance, such that a magnitude of the first inductance is at least ten times greater than a magnitude of the third inductance.

20. The circuitry of claim 19 wherein the magnitude of the first inductance is at least three times greater than a magnitude of the second inductance.

21. Circuitry comprising:
switching circuitry having a switching circuitry output;
a first parallel amplifier having a first feedback input and a first parallel amplifier output, such that a first inductive element is coupled between the switching circuitry output and the first feedback input; and
a second parallel amplifier having a second feedback input and a second parallel amplifier output, such that a second inductive element is coupled between the first feedback input and the second feedback input, wherein:
a third inductive element is coupled between the first parallel amplifier output and the first feedback input; and
a fourth inductive element is coupled between the second parallel amplifier output and the second feedback input.

22. The circuitry of claim 21 wherein:
the first parallel amplifier is adapted to partially provide a first power supply output signal via the first parallel amplifier output based on a voltage setpoint;
the second parallel amplifier is adapted to partially provide the first power supply output signal via the second parallel amplifier output based on the voltage setpoint;
a phase-shift across the third inductive element at least partially compensates for limited open loop gain of the first parallel amplifier at frequencies above a first frequency threshold; and a phase-shift across the fourth inductive element at least partially compensates for limited open loop gain of the second parallel amplifier at frequencies above a second frequency threshold.

23. The circuitry of claim 21 wherein the first inductive element has a first inductance, the second inductive element has a second inductance, the third inductive element has a third inductance, and the fourth inductive element has a fourth inductance, such that a magnitude of the second inductance is at least ten times greater than a magnitude of the fourth inductance.

24. The circuitry of claim 23 wherein a magnitude of the first inductance is at least three times greater than the magnitude of the second inductance.

25. Circuitry comprising:
switching circuitry having a switching circuitry output;
a first parallel amplifier having a first feedback input and a first parallel amplifier output, such that a first inductive element is coupled between the switching circuitry output and the first feedback input; and the first parallel amplifier is configured to partially provide a first power supply output signal via the first parallel amplifier output and a second inductive element based on a voltage setpoint; and
a second parallel amplifier having a second feedback input and a second parallel amplifier output, such that the second inductive element and a third inductive element are coupled in series between the first feedback input and the second feedback input.

26. A method comprising:
partially providing a first power supply output signal via a series combination of a first inductive element and a second inductive element;
partially providing the first power supply output signal via a first parallel amplifier output based on a voltage setpoint and feeding back a voltage to a first feedback input from a first connection node between the first inductive element and the second inductive element; and
partially providing the first power supply output signal via a second parallel amplifier output based on the voltage setpoint and feeding back a voltage to a second feedback input from the second inductive element.

* * * * *